United States Patent
Matsuda et al.

(10) Patent No.: US 7,830,067 B2
(45) Date of Patent: Nov. 9, 2010

(54) ELASTIC BOUNDARY WAVE DEVICE

(75) Inventors: Satoru Matsuda, Kawasaki (JP); Michio Miura, Kawasaki (JP); Takashi Matsuda, Kawasaki (JP); Masanori Ueda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 12/431,427

(22) Filed: Apr. 28, 2009

(65) Prior Publication Data

US 2009/0212659 A1     Aug. 27, 2009

Related U.S. Application Data

(62) Division of application No. 11/714,157, filed on Mar. 6, 2007, now abandoned.

(30) Foreign Application Priority Data

Mar. 7, 2006   (JP) .............................. 2006-061693

(51) Int. Cl.
   *H01L 41/04* (2006.01)
(52) U.S. Cl. ................................ 310/313 R; 310/313 C
(58) Field of Classification Search ............. 310/313 R, 310/313 A, 313 B, 313 C, 313 D
   See application file for complete search history.

(56) References Cited

U.S. PATENT DOCUMENTS

| | | | | |
|---|---|---|---|---|
| 4,617,487 A | * | 10/1986 | Sone et al. | 310/313 D |
| 7,322,093 B2 | | 1/2008 | Kadota et al. | |
| 2006/0138902 A1 | * | 6/2006 | Kando | 310/313 D |
| 2006/0175928 A1 | * | 8/2006 | Kando | 310/311 |

FOREIGN PATENT DOCUMENTS

| | | | |
|---|---|---|---|
| EP | 1 026 823 A2 | | 8/2000 |
| JP | 4-082315 A | | 3/1992 |
| JP | 4-239210 A | | 8/1992 |
| JP | 6-112764 A | | 4/1994 |
| JP | 2000-232333 A | | 8/2000 |
| JP | 2001-111377 | * | 4/2001 |
| KR | 0371573 | | 8/2001 |
| WO | WO 2005/069486 A1 | | 7/2005 |
| WO | WO 2005/093949 A1 | | 10/2005 |

* cited by examiner

*Primary Examiner*—Walter Benson
*Assistant Examiner*—Derek J Rosenau
(74) *Attorney, Agent, or Firm*—Arent Fox LLP

(57) ABSTRACT

An elastic boundary wave device includes a first medium with piezoelectricity, an electrode exciting an elastic wave and provided on the first medium, a second medium made of a different material from the first medium and provided on the first medium to cover the electrode, and a sound absorbing portion provided on the second medium.

10 Claims, 9 Drawing Sheets

ELASTIC BOUNDARY WAVE DEVICE

CROSS-REFERENCE TO RELATED APPLICATION

This is a Divisional Application which claims the benefit of pending U.S. patent application Ser. No. 11/714,157, filed Mar. 6, 2007. The disclosure of the prior application is hereby incorporated herein in its entirety by reference.

BACKGROUND OF THE INVENTION

1. Field of the Invention

This invention relates generally to elastic boundary wave devices, and more particularly, to an elastic boundary wave device that can suppress an unnecessary response.

2. Description of the Related Art

There are known surface acoustic wave (hereinafter, referred to as SAW) devices, as one of the devices that utilize elastic waves. The SAW devices are for use in various circuits such as, for example, transmit bandpass filters, receive bandpass filters, local filters, antenna duplexers, intermediate frequency (IF) filters, and frequency modulation (FM) modulators, in which wireless signals ranging from 45 MHz to 2 GHz in the frequency band are processed. Those wireless signals are typically used by, for example, mobile telephones.

In recent years, there have been developed elastic boundary wave devices that utilized elastic boundary waves. In an elastic boundary wave device, elastic waves are concentrated in the boundary of two different mediums. Therefore, even if a foreign material is adhered to outer surfaces of the two mediums, there will be no change or degradation in the characteristics, such as the variation of the frequency or the increase in the electric loss, unlike the SAW device.

In the SAW device, there is a problem of an unnecessary response that is never used by a resonator. Therefore, as disclosed in Japanese Patent Application Publication No. 6-112764 (hereinafter, referred to as Document 1), there is provided an absorber or grating at an edge of the substrate in the SAW device to suppress the unnecessary surface waves that have been reflected. Also, as disclosed in Japanese Patent Application Publication No. 4-239210 (hereinafter, referred to as Document 2), the reflection of bulk waves is suppressed by providing a sound absorbing material at an end surface of the substrate of the SAW device. In addition, as disclosed in Japanese Patent Application Publication No. 4-82315 (hereinafter, referred to as Document 3), there is a technique for suppressing the reflection of the bulk wave by providing a step at an end surface of the substrate of the SAW device.

SUMMARY OF THE INVENTION

The present invention has been made in view of the above circumstances and provides an elastic boundary wave device in where an unnecessary response can be suppressed, whereas the unnecessary response is an excited wave other than a boundary wave present in the boundary of different two mediums.

According to one aspect of the present invention, there is provided an elastic boundary wave device including: a first medium with piezoelectricity; an electrode exciting an elastic wave and provided on the first medium; a second medium made of a different material from the first medium and provided on the first medium to cover the electrode; and a sound absorbing portion provided on the second medium.

According to another aspect of the present invention, there is provided an elastic boundary wave device including: a first medium with piezoelectricity; an electrode exciting an elastic wave and provided on the first medium; a second medium made of a different material from the first medium and provided on the first medium to cover the electrode; and a protrusion provided on the second medium.

The sound absorbing portion reduces the energy of the surface wave on the surface of the second or third medium, thereby reducing the unnecessary response caused by the surface wave.

According to yet another aspect of the present invention, there is provided an elastic boundary wave device including: a first medium with piezoelectricity; an electrode exciting an elastic wave and provided on the first medium; a second medium made of a different material from the first medium and provided on the first medium to cover the electrode; and a third medium made of a different material from the first medium and the second medium and provided on the second medium, and the third medium has a thickness of 0.25 times or more of a periodicity of the electrode.

BRIEF DESCRIPTION OF THE DRAWINGS

Exemplary embodiments of the present invention will be described in detail with reference to the following drawings, wherein.

DESCRIPTION OF THE PREFERRED EMBODIMENTS

Figure 1:
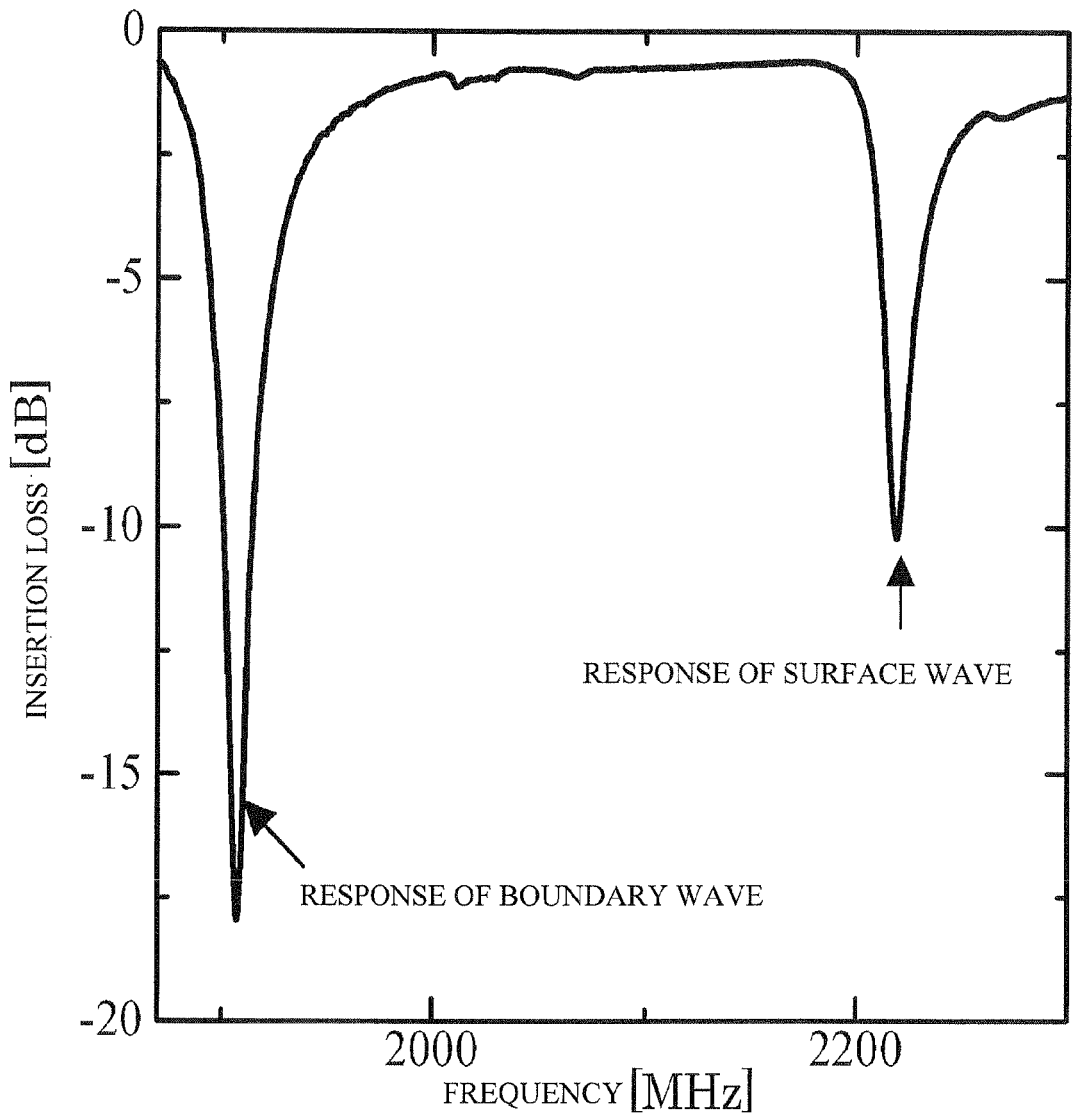
FIG. 1 shows usual insertion loss of the elastic boundary wave device, with respect to frequency.

FIG. 1 is a view showing passband characteristics of a one-port resonator having an elastic boundary wave device therein. In addition to a response of the boundary wave at a lower frequency side, an unnecessary response is present at a higher frequency side. When such unnecessary response is present, excellent suppression characteristics are not available in an elastic boundary wave device for use in a filter. The unnecessary response hinders the excellent frequency characteristics. According to the experiment carried out by the inventors of the present invention, such unnecessary response of the elastic boundary wave device is substantially different in the characteristic from the spurious of small cycles, which are found in the conventional SAW devices. For this reason, the unnecessary response cannot be suppressed by providing the sound absorbing material or step at the end surface of the substrate as described in Document 1 through Document 3. As a cause of the unnecessary response, it is believed that the unnecessary response comes from the surface wave of the elastic boundary wave device, and must be a sezawa wave, which is a higher mode of Rayleigh wave, judging from the size of the response. Accordingly, a description will now be given, with reference to the accompanying drawings, of exemplary embodiments of the present invention, with regards to the elastic boundary wave device where the unnecessary response can be suppressed.

First Exemplary Embodiment

Figure 2:
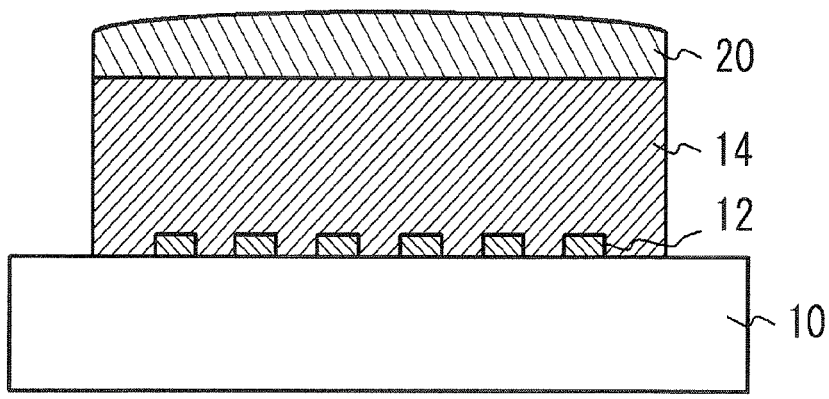
FIG. 2 is a cross-sectional view of an elastic boundary wave device employed in a first exemplary embodiment of the present invention.

A first exemplary embodiment of the present invention is an example in which a sound absorbing portion is provided at a surface. FIG. 2 is a cross-sectional view of an elastic boundary wave device employed in the first exemplary embodiment of the present invention. There is provided an electrode 12 made of a metal such as Cu (copper) or the like on a piezoelectric substrate 10 (first medium) of a rotation-Y plate LN (LiNbO$_3$) substrate. The electrode 12 is interdigital transducers (IDTs) or comb-like electrodes to excite elastic waves. There is provided on the piezoelectric substrate 10, a silicon oxide film 14 (second medium) made up of a different material from the piezoelectric substrate 10, to cover the electrode 12. There is also provided on the silicon oxide film 14, a sound absorbing portion 20 made of a silicon resin. The silicon oxide film 14 has an acoustic velocity slower than that of the piezoelectric substrate 10. Accordingly, the elastic boundary waves concentrate on and propagate along the boundary between the silicon oxide film 14 and the piezoelectric substrate 10.

Figure 3:
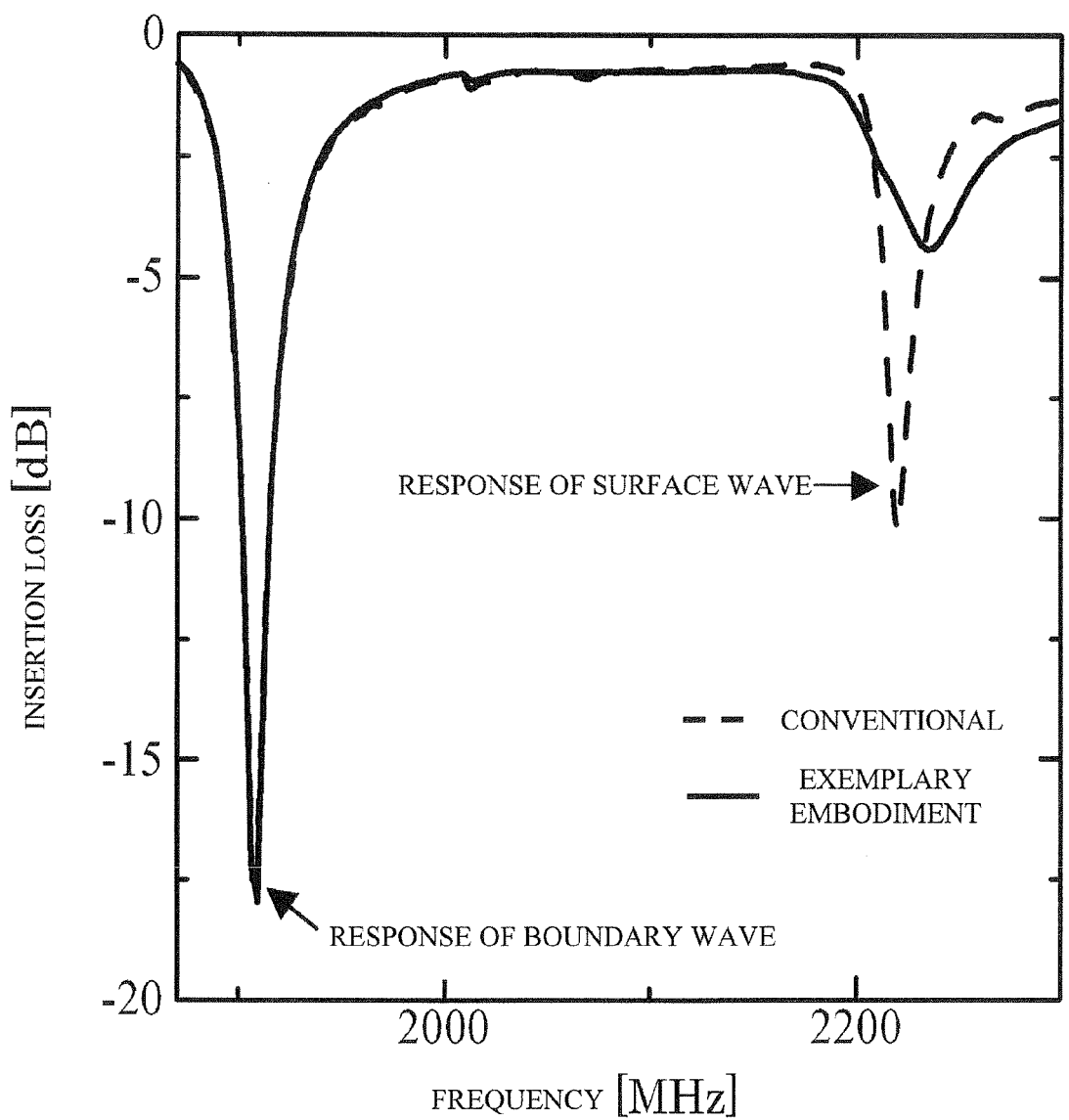
FIG. 3 shows insertion loss of the elastic boundary wave device employed in the first exemplary embodiment of the present invention, with respect to frequency.

FIG. 3 shows insertion loss of the elastic boundary wave device (conventional example) that does not include the sound absorbing portion 20 and that of the elastic boundary wave device employed in the first exemplary embodiment, with respect to frequency. In the elastic boundary wave device employed in the first exemplary embodiment, the unnecessary response due to the surface wave at the higher frequency side is smaller. In accordance with the first exemplary embodiment of the present invention, the sound absorbing portion 20 provided on the silicon oxide film 14 reduces the energy of the surface wave on the surface of the silicon oxide film 14, thereby enabling the unnecessary response resulted from the surface wave to be decreased. Here, the sound absorbing portion 20 is made of a material, for example, resin, which reduces the energy of the surface wave on the surface of the silicon oxide film 14. As a resin, epoxy resin, silicon resin, phenol resin, ultraviolet curing resin, and polyimide resin may be used. In consideration of the mounting process onto the package, the resin preferably has the heat resistance of 150° C. or more. Also, the sound absorbing portion 20 on the silicon oxide film 14 is preferably provided over the whole surface of the silicon oxide film 14. However, the sound absorbing portion 20 may be partially provided on the silicon oxide film 14.

Second Exemplary Embodiment

Figure 4:
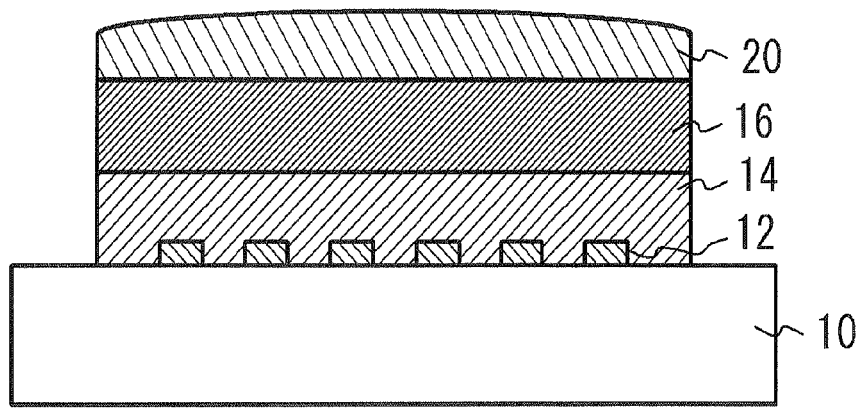
FIG. 4 is a cross-sectional view of an elastic boundary wave device employed in a second exemplary embodiment of the present invention.

A second exemplary embodiment of the present invention is an example in which an aluminum oxide film 16 is interposed between the silicon oxide film 14 and the sound absorbing portion 20. Referring now to FIG. 4, the elastic boundary wave device employed in the second exemplary embodiment includes the aluminum oxide film 16 (third medium) is provided between the silicon oxide film 14 and the sound absorbing portion 20. The aluminum oxide film 16 is made of a different material from the piezoelectric substrate 10 and the silicon oxide film 14. In the second exemplary embodiment, the same components and configurations as those employed in the first exemplary embodiment have the same reference numerals and a detailed explanation will be omitted. In accordance with the second exemplary embodiment, there is provided on the silicon oxide film 14, the aluminum oxide film 16 of a higher acoustic velocity than that of the silicon oxide film 14, thereby confining the elastic boundary wave inside the silicon oxide film 14. Also, the sound absorbing portion 20 provided on the aluminum oxide film 16 reduces the energy of the surface wave propagating on the surface of the aluminum oxide film 16, thereby decreasing the unnecessary response caused by the surface wave.

Third Exemplary Embodiment

Figure 5A:
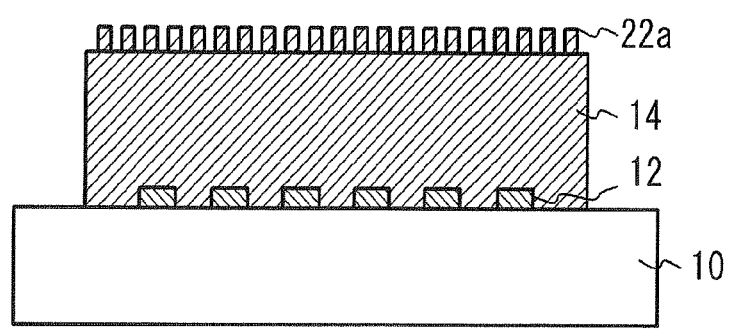
FIG. 5A through FIG. 5D are first cross-sectional views of an elastic boundary wave device employed in a third exemplary embodiment of the present invention.
Figure 5B:
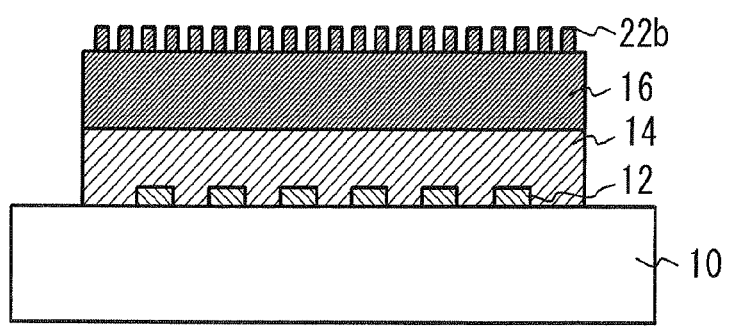
Figure 5C:
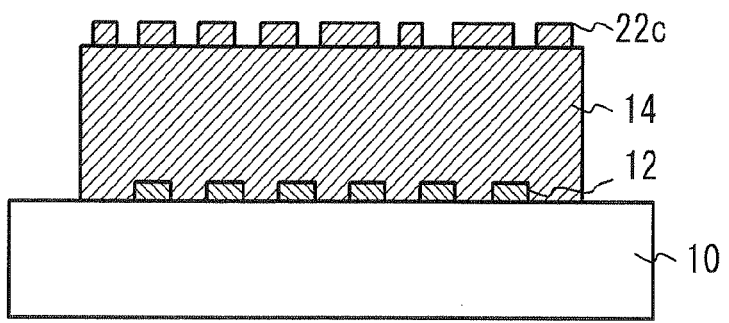
Figure 5D:
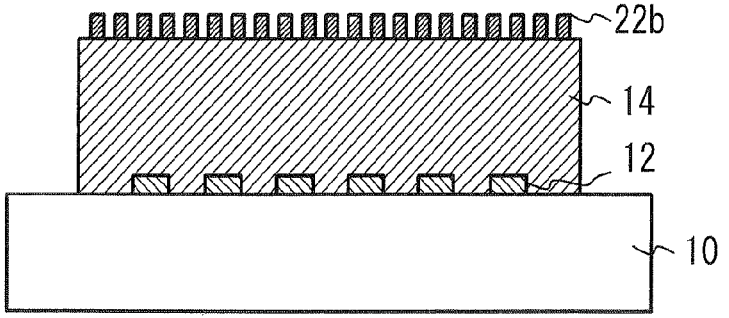

A third exemplary embodiment of the present invention is an example in which there are provided protrusions on a silicon oxide film or on an aluminum oxide film. Referring now to FIG. 5A, there is provided the electrode 12 on the piezoelectric substrate 10 (first medium). There is provided on the piezoelectric substrate 10, the silicon oxide film 14 (second medium) made of a different material from the piezoelectric substrate 10 so as to cover the electrode 12. There are provided on the silicon oxide film 14, multiple protrusions 22a made of silicon oxide on a periodic basis. Referring to FIG. 5B, there are provided on the silicon oxide film 14, the aluminum oxide film 16 shown in FIG. 5A, and there are also provided on the aluminum oxide film 16, multiple protrusions 22b made of aluminum oxide on a periodic basis. Referring to FIG. 5C, there are provided on the silicon oxide film 14, multiple protrusions 22c on an irregular basis. Referring to FIG. 5D, there are provided on the silicon oxide film 14, the protrusions 22b made of aluminum oxide on a periodic basis.

Figure 6A:
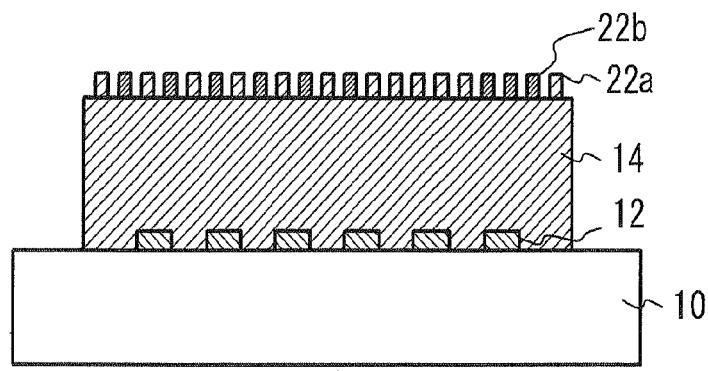
FIG. 6A through FIG. 6D are second cross-sectional views of the elastic boundary wave device employed in the third exemplary embodiment of the present invention.
Figure 6B:
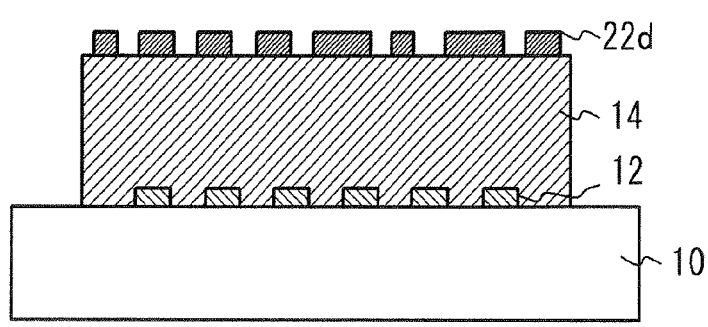
Figure 6C:
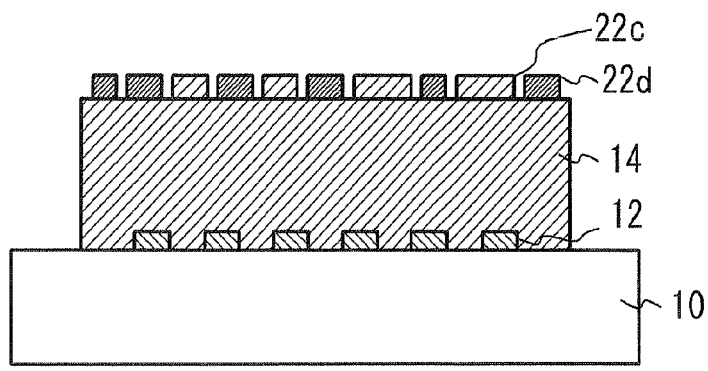
Figure 6D:
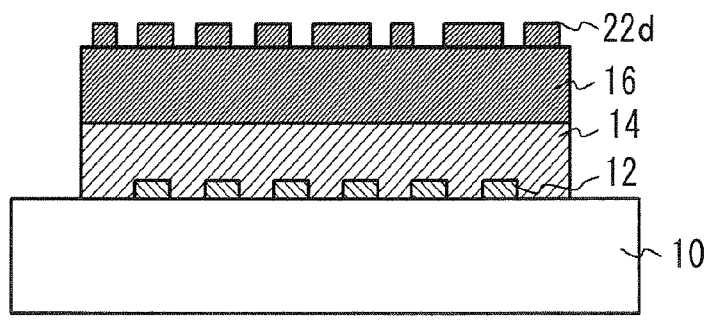

Referring to FIG. 6A, there are provided on the silicon oxide film 14, the multiple protrusions 22a made of silicon oxide, and the multiple protrusions 22b made of aluminum oxide on a periodic basis. Referring to FIG. 6B, there are provided on the silicon oxide film 14, multiple protrusions 22d made of aluminum oxide on an irregular basis. Referring to FIG. 6C, there are provided on the silicon oxide film 14, the multiple protrusions 22c made of silicon oxide and the multiple protrusions 22d made of aluminum oxide on an irregular basis. Referring to FIG. 6D, there are provided on the aluminum oxide film 16, the multiple protrusions 22d made of aluminum oxide on an irregular basis, the aluminum oxide film 16 being provided on the silicon oxide film 14.

Figure 7A:
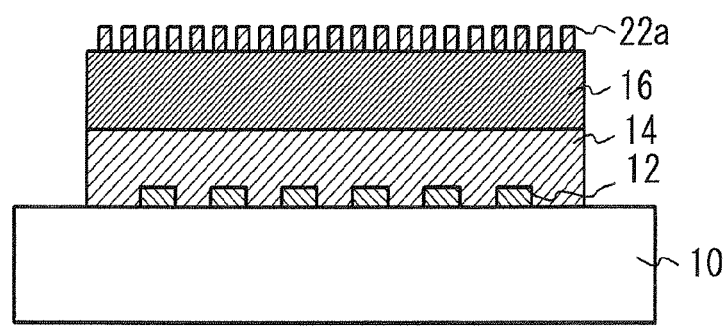
FIG. 7A through FIG. 7D are third cross-sectional views of the elastic boundary wave device employed in the third exemplary embodiment of the present invention.
Figure 7B:
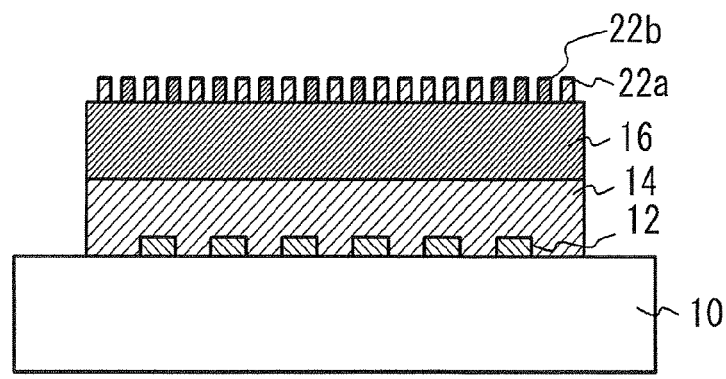
Figure 7C:
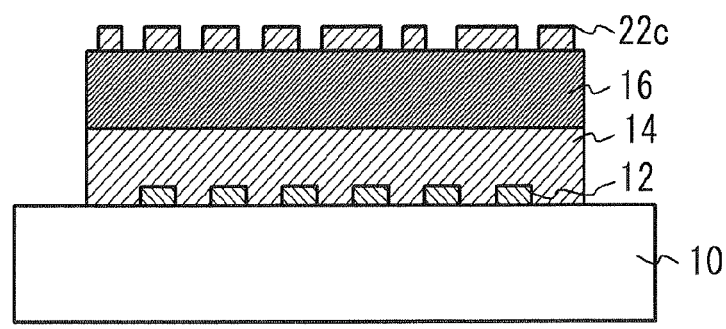
Figure 7D:
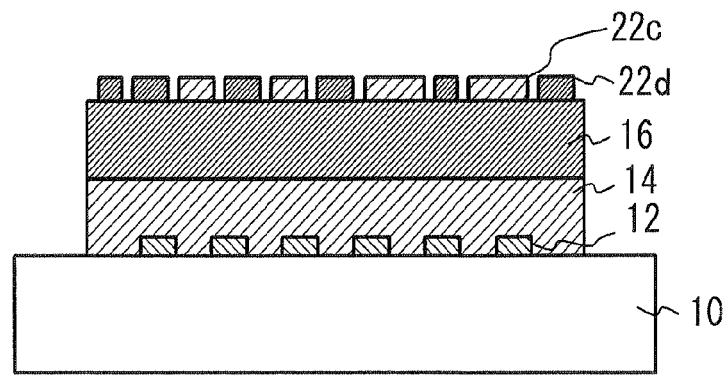

Referring to FIG. 7A, there are provided on the aluminum oxide film 16, the protrusions 22a made of silicon oxide, the aluminum oxide film 16 being provided on the silicon oxide film 14 on a periodic basis. Referring to FIG. 7B, there are provided on the aluminum oxide film 16, the multiple protrusions 22a made of silicon oxide and the multiple protrusions 22b made of aluminum oxide on a periodic basis, the aluminum oxide film 16 being provided on the silicon oxide film 14. Referring to FIG. 7C, there are provided on the aluminum oxide film 16, the multiple protrusions 22c made of silicon oxide on an irregular basis, the aluminum oxide film 16 being provided on the silicon oxide film 14. Referring to FIG. 7D, there are provided on the aluminum oxide film 16, the multiple protrusions 22c made of silicon oxide and the multiple protrusions 22d made of aluminum oxide on an irregular basis, the aluminum oxide film 16 being provided on the silicon oxide film 14.

In accordance with the third exemplary embodiment of the present invention, there are provided on the silicon oxide film 14, the multiple protrusions 22a, the protrusions 22b, the protrusions 22c, or the protrusions 22d. The protrusions 22a, the protrusions 22b, the protrusions 22c, or the protrusions 22d scatter the surface waves propagating on the surface of the silicon oxide film 14 or the aluminum oxide film 16. This enables the unnecessary response caused by the surface wave to be decreased. In the third exemplary embodiment of the present invention, it is configured such that the protrusions 22a, the protrusions 22b, the protrusions 22c, or the protrusions 22d have heights ranging from 0.5 μm to 2.0 μm. However, the present invention is not limited to this. Also, in the third exemplary embodiment of the present invention, the multiple protrusions 22a, the multiple protrusions 22b, the multiple protrusions 22c, or the multiple protrusions 22d are provided on the whole surface of the silicon oxide film 14 or on the aluminum oxide film 16. However, it is only necessary to provide at least one of the protrusions 22a, the protrusions 22b, the protrusions 22c, and the protrusions 22d, and it is only necessary to provide the protrusions partially on the surface of the silicon oxide film 14 or on the aluminum oxide film 16. In addition, the protrusions 22a, the protrusions 22b, the protrusions 22c, and the protrusions 22d have periodicities, widths, and gaps shown smaller than those of the electrode 12, in FIG. 5A through FIG. 5D, in FIG. 6A through FIG. 6D, and in FIG. 7A through FIG. 7D. However, since six fingers of the electrode 12 are schematically shown, the protrusions 22a, the protrusions 22b, the protrusions 22c, and the protrusions 22d generally have periodicities, widths, and gaps greater than those of the electrode 12.

As shown in FIG. 5A, FIG. 5b, FIG. 5D, FIG. 6A, FIG. 7A, and FIG. 7B, the multiple protrusions 22a or 22b may have different periodicities from that of the electrode 12. The multiple protrusions 22a or 22b have different periodicities from that of the electrode 12, thereby enabling the surface wave leading to an unnecessary response to be scattered. As shown in FIG. 5C, FIG. 6B, FIG. 6C, FIG. 6D, FIG. 7C, and FIG. 7D, the multiple protrusions 22a or 22b may be provided on an irregular basis.

As shown in FIG. 5A, FIG. 5C, FIG. 7A, and FIG. 7C, a same material as that of the silicon oxide film 14 may be employed for the protrusions 22a or the protrusions 22c. As shown in FIG. 5B, FIG. 5D, FIG. 6B, and FIG. 6D, a different material from that of the silicon oxide film 14 may be employed for the protrusions 22b or the protrusions 22d. As shown in FIG. 6A, FIG. 6C, FIG. 7B, and FIG. 7D, a same material as that of the silicon oxide film 14 may be employed for a portion of the protrusions 22a or the protrusions 22c, and a different material from that of the silicon oxide film 14 may be employed for a portion of the protrusions 22b or the protrusions 22d.

As shown in FIG. 5B, FIG. 6D, and FIG. 7A through FIG. 7D, the aluminum oxide film 16 may be provided between the silicon oxide film 14 and the protrusions 22a, the protrusions 22b, the protrusions 22c, or the protrusions 22d. As shown in FIG. 5B and FIG. 6D, a same material as that of the aluminum oxide film 16 may be employed for the protrusions 22b and the protrusions 22d. As shown in FIG. 7B and FIG. 7D, a portion of the multiple protrusions may be composed of the protrusions 22a or the protrusions 22c, made of a same material as that of the silicon oxide film 14, and another portion thereof may be made of a same material as that of the aluminum oxide film 16. In this manner, the material used for the protrusions may be selected arbitrarily.

Fourth Exemplary Embodiment

Figure 8A:
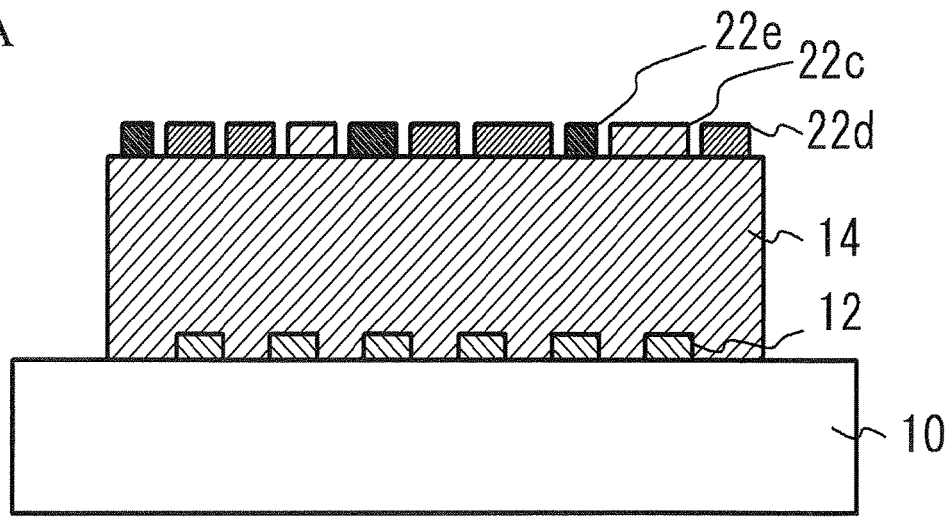
FIG. 8A and FIG. 8B are cross-sectional views of an elastic boundary wave device employed in a fourth exemplary embodiment of the present invention.

A fourth exemplary embodiment of the present invention is an example in which the protrusions include three different materials. Referring now to FIG. 8A, there are provided on the silicon oxide film 14, the multiple protrusions 22c made of silicon oxide, the multiple protrusions 22d made of aluminum oxide, and protrusions 22e made of a different material from silicon oxide and from aluminum oxide on an irregular basis.

Figure 8B:
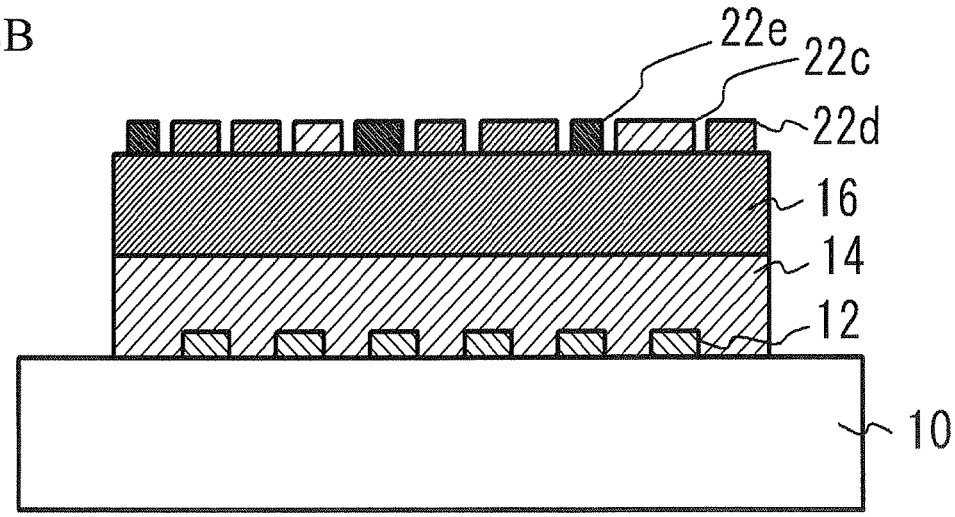

FIG. 8B shows another example of the fourth exemplary embodiment of the present invention. There is provided the aluminum oxide film 16 (third medium) between the silicon oxide film 14 and the protrusions 22c and the protrusions 22d. In accordance with the fourth exemplary embodiment, three or more different materials may be used for each of the protrusions 22a through 22e. In the fourth exemplary embodiment of the present invention, the protrusions 22c, the protrusions 22d, and the protrusions 22d are provided on an irregular basis. However, the protrusions 22c, the protrusions 22d, and protrusions 22e may be provided on a periodic basis.

Fifth Exemplary Embodiment

Figure 9A:
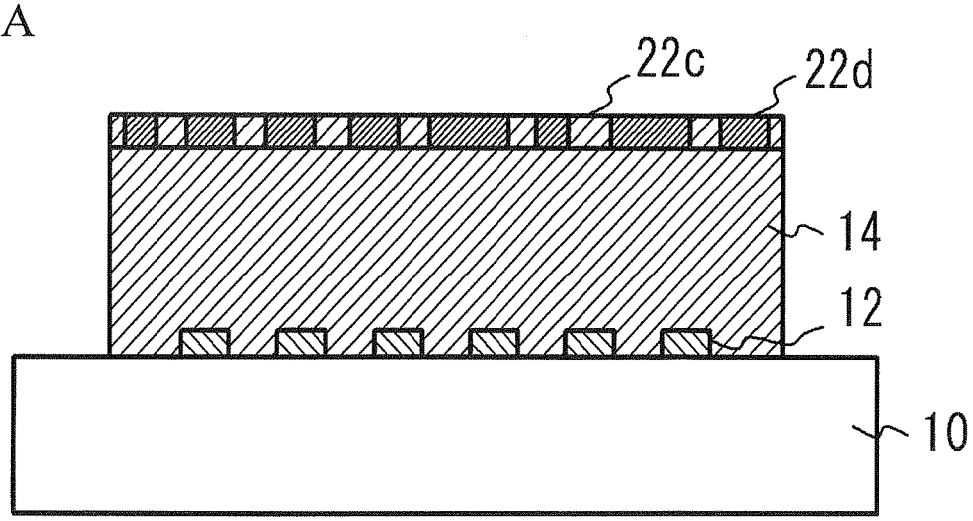
FIG. 9A and FIG. 9B are cross-sectional views of an elastic boundary wave device employed in a fifth exemplary embodiment of the present invention.

A fifth exemplary embodiment of the present invention is an example in which the protrusions 22c and the protrusions 22d have a plane surface. Referring now to FIG. 9A, there is provided the electrode 12 on the piezoelectric substrate 10 (first medium). There is provided on the piezoelectric substrate 10, the silicon oxide film 14 (second medium) made of a different material from the piezoelectric substrate 10 so as to cover the electrode 12. There are provided on the silicon oxide film 14, the multiple protrusions 22d made of aluminum oxide on an irregular basis. There are provided the protrusions 22c made of silicon oxide between the protrusions 22d.

Figure 9B:
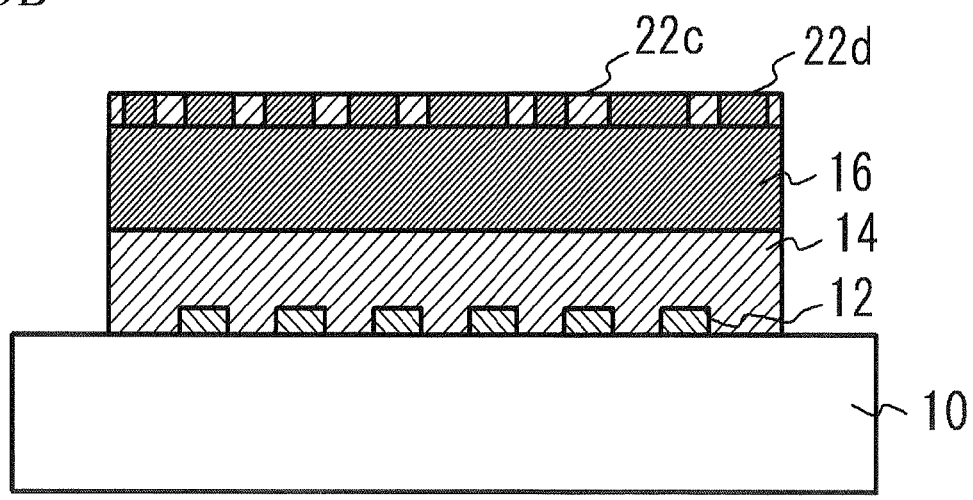

FIG. 9B shows another example of the fifth exemplary embodiment of the present invention. There is provided the aluminum oxide film 16 (third medium) between the silicon oxide film 14 and the protrusions 22c and the protrusions 22d. In accordance with the fifth exemplary embodiment of the present invention, there are provided the protrusions 22c and the protrusions 22d made of different materials from each other in contact with each other such that the protrusions 22c and the protrusions 22d have a plane surface as a whole. In the fifth exemplary embodiment of the present invention, the protrusions 22c and the protrusions 22d are provided on an irregular basis. However, the protrusions 22c and the protrusions 22d may be provided on a periodic basis. Also, another material other than the second medium and the third medium may be used for the protrusions 22c and the protrusions 22d.

Sixth Exemplary Embodiment

Figure 10A:
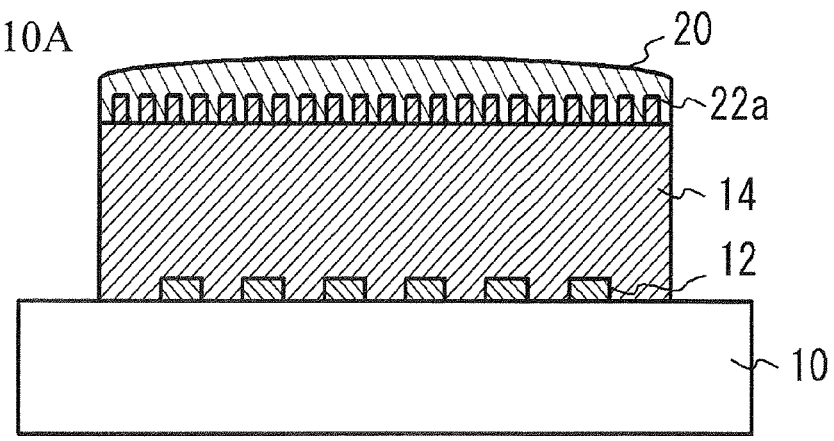
FIG. 10A and FIG. 10B are cross-sectional views of an elastic boundary wave device employed in a sixth exemplary embodiment of the present invention.

A sixth exemplary embodiment of the present invention is an example in which one or more protrusions and a sound absorbing portion are provided on the silicon oxide film or on the aluminum oxide film. Referring now to FIG. 10A, there is provided the electrode 12 on the piezoelectric substrate 10 (first medium). There is provided on the piezoelectric substrate 10, the silicon oxide film 14 (second medium) made of a different material from the piezoelectric substrate 10 to cover the electrode 12. There are provided on the silicon oxide film 14, the multiple protrusions 22a made of silicon oxide on a periodic basis. There is also provided on the silicon oxide film 14 and on the protrusions 22a, the sound absorbing portion 20 made of, for example, silicon resin.

Figure 10B:
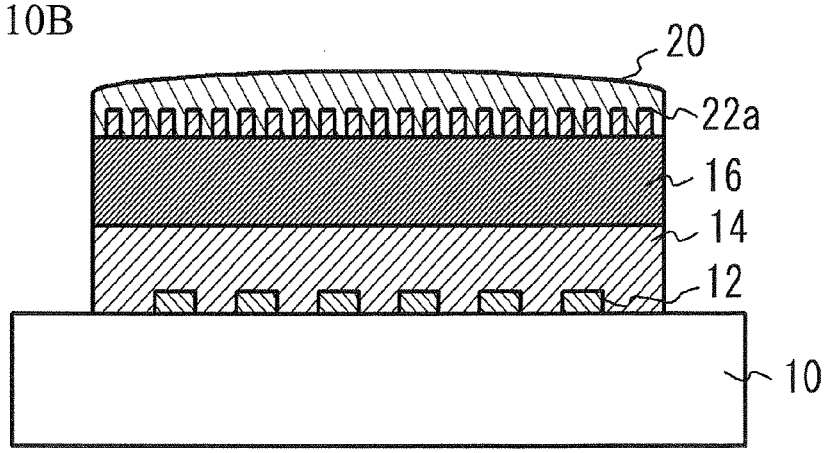

FIG. 10B shows another example of a sixth exemplary embodiment of the present invention. There is provided the aluminum oxide film 16 (third medium) between the silicon oxide film 14 and the protrusions 22a. In accordance with the sixth exemplary embodiment, the sound absorbing portion 20 decreases the energy of the surface waves propagating on the surface of the silicon oxide film 14 and on the surface of the protrusions 22a, or on the surface of the aluminum oxide film 16 and on the surface of the protrusions 22a.

Seventh Exemplary Embodiment

Figure 11:
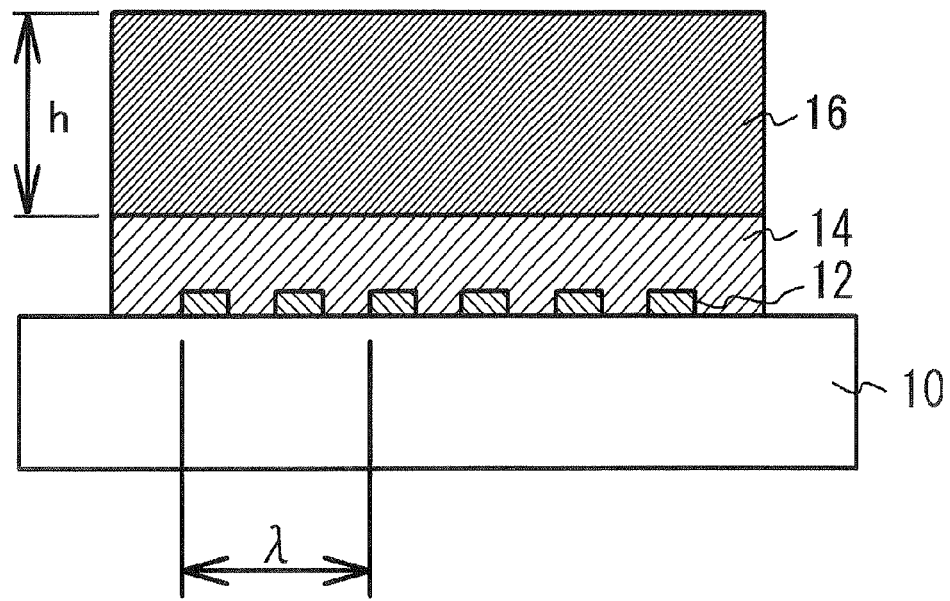
FIG. 11 is a cross-sectional view of an elastic boundary wave device employed in a seventh exemplary embodiment of the present invention.
Figure 12:
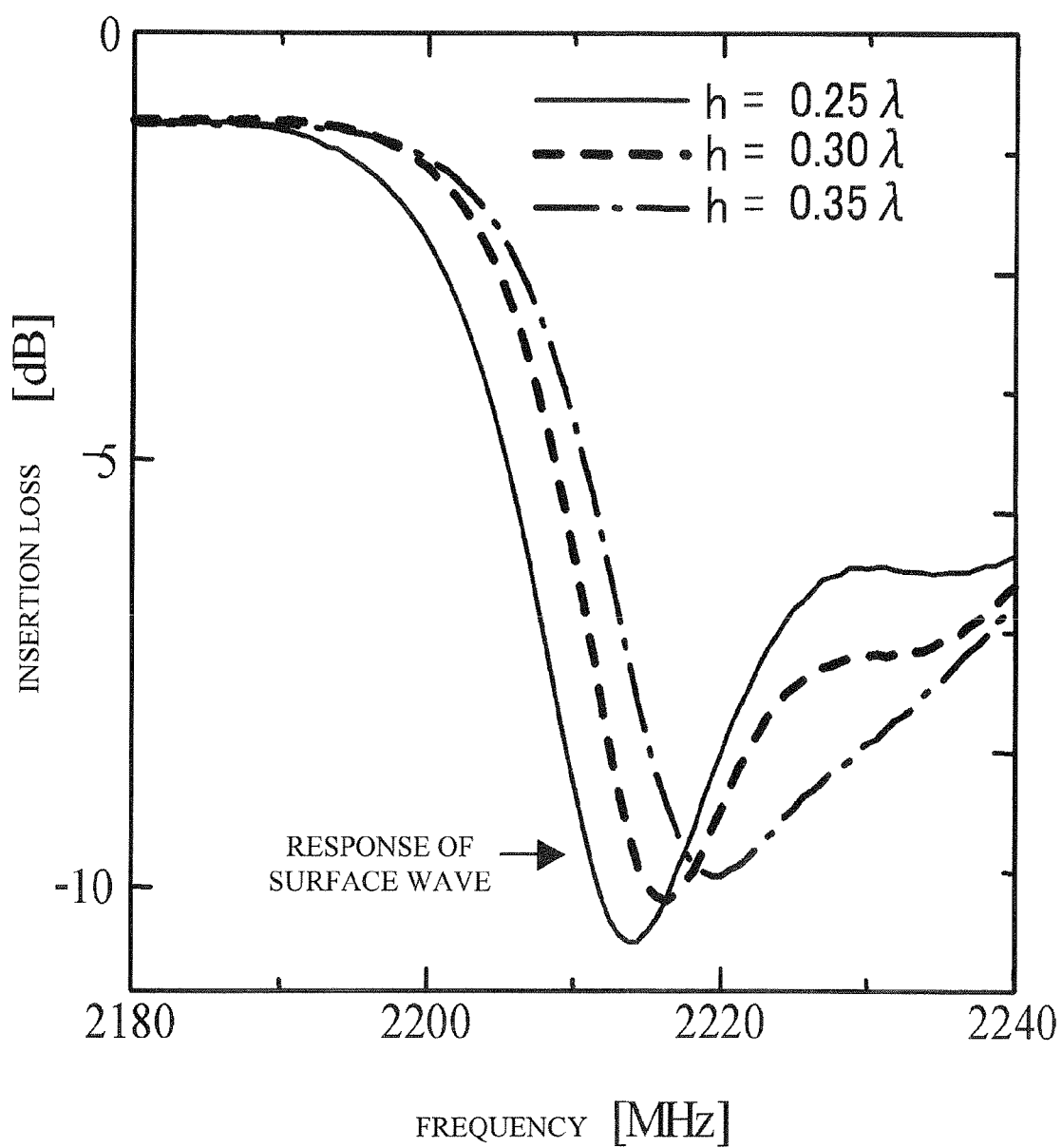
FIG. 12 shows the insertion loss of the elastic boundary wave device employed in the seventh exemplary embodiment of the present invention, with respect to frequency of a surface wave.

A seventh exemplary embodiment of the present invention is an example in which the aluminum oxide film 16 is thicker. Referring now to FIG. 11, an elastic boundary wave device employed in the seventh exemplary embodiment includes the electrode 12 arranged on the piezoelectric substrate 10 (first medium). There is provided on the piezoelectric substrate 10, the silicon oxide film 14 (second medium) made of a different material from that of the piezoelectric substrate 10 to cover the electrode 12. There is provided on the silicon oxide film 14, the aluminum oxide film 16 (third medium) to be thicker. FIG. 12 is an enlarged view of a surface wave response in the passband characteristics of the one-port resonator having the elastic boundary wave device therein when a thickness h of the aluminum oxide film 16 is changed. When the thickness h of the aluminum oxide film 16 is gradually made thicker $0.25\lambda$, $0.3\lambda$, and $0.35\lambda$ where the electrode 12 has a periodicity of $\lambda$, the response from the surface wave is decreased. Also, when the thickness h of the aluminum oxide film 16 is smaller than $0.25\lambda$, the boundary wave is attenuated. This is not desirable. As stated, it is preferable that the thickness h of the aluminum oxide film 16 be thick. In particular, an unnecessary response can be suppressed by causing the thickness h of the aluminum oxide film 16 to be 0.25 times or more of the periodicity $\lambda$. In addition, in the elastic boundary wave device used in FIG. 9A and FIG. 9B, the silicon oxide film 14 has a thickness of 500 nm, and the electrode 12 has a periodicity of 2,000 nm.

In the first through seventh exemplary embodiments of the present invention, a description has been given as an example where the LN piezoelectric substrate 10 serves as the first medium, the silicon oxide film 14 serves as the second medium, the aluminum oxide film 16 serves as the third medium, and Cu is used for the electrode 12. Optionally, the first medium may be made of a material with piezoelectricity such as a $LiTaO_3$ substrate or the like, and the second medium may be made of a different material from the first medium. Preferably, the second medium is made of a material having a slower sound velocity than those of the first and third mediums, since the elastic boundary wave is confined in the periphery of the boundary. Also, it is only necessary for the electrode 12 made of a conductive material. Preferably, a metal of high density such as Cu or Au is employed for the electrode 12 so as to suppress the reflection of the elastic boundary wave.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention is based on Japanese Patent Application No. 2006-061693 filed on Mar. 7, 2006, the entire disclosure of which is hereby incorporated by reference.

What is claimed is:

1. An elastic boundary wave device comprising:
    a first medium with piezoelectricity;
    an electrode exciting an elastic wave and provided on the first medium;
    a second medium made of a different material from the first medium and provided on the first medium to cover the electrode; and
    multiple protrusions provided on the second medium,
    wherein the multiple protrusions have different pitches.

2. The elastic boundary wave device as claimed in claim 1, wherein the multiple protrusions are made of a different material from the second medium.

3. The elastic boundary wave device as claimed in claim 1, wherein a portion of the multiple protrusions is made of a same material as the second medium and another portion of the multiple protrusions is made of a different material from the second medium.

4. The elastic boundary wave device as claimed in claim 1, wherein the multiple protrusions are made of a same material as the second medium.

5. The elastic boundary wave device as claimed in claim 1, wherein the multiple protrusions are made of a different material from the second medium.

6. The elastic boundary wave device as claimed in claim 1, wherein a portion of the multiple protrusions is made of a same material as the second medium and another portion of the multiple protrusions is made of a different material from the second medium.

7. The elastic boundary wave device as claimed in claim 1, further comprising a third medium provided between the second medium and the multiple protrusions,
    wherein the first medium and the second medium are made of different materials.

8. The elastic boundary wave device as claimed in claim 7, wherein the multiple protrusions are made of a same material as the third medium.

9. The elastic boundary wave device as claimed in claim 7, wherein a portion of the multiple protrusions is made of a same material as the second medium and another portion of the multiple protrusions is made of a same material as the third medium.

10. The elastic boundary wave device as claimed in claim 1, wherein the multiple protrusions are made of the same material as the second medium, the device further comprising:
    a third medium provided between the second medium and the multiple protrusions, wherein the third medium is made of a different material than the first medium and the second medium.

* * * * *